(12) United States Patent
Kim

(10) Patent No.: US 7,538,619 B2
(45) Date of Patent: May 26, 2009

(54) OSCILLATOR REDUCING CLOCK SIGNAL VARIATIONS DUE TO VARIATIONS IN VOLTAGE OR TEMPERATURE

(75) Inventor: Ho-jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 11/790,012

(22) Filed: Apr. 23, 2007

(65) Prior Publication Data

US 2007/0285186 A1 Dec. 13, 2007

(30) Foreign Application Priority Data

May 4, 2006 (KR) .................. 10-2006-0040514

(51) Int. Cl.
*H03L 7/085* (2006.01)
(52) U.S. Cl. .................. 331/1 A; 331/1 R
(58) Field of Classification Search ........... 331/1 A–1 R
See application file for complete search history.

(56) References Cited

U.S. PATENT DOCUMENTS 4,513,259 A * 4/1985 Frerking .................. 331/176

FOREIGN PATENT DOCUMENTS

| JP | 06-169237 | 6/1994 |
| JP | 2004-048690 | 2/2004 |
| JP | 2004-304564 | 10/2004 |

* cited by examiner

*Primary Examiner*—Jean B Jeanglaude
(74) *Attorney, Agent, or Firm*—Volentine & Whitt, PLLC

(57) ABSTRACT

Provided is an oscillator including a logic signal generator and a clock generator. The logic signal generator generates a first logic signal and a second logic signal that have the same period but have different logic level transition timing. The clock generator generates a clock signal in response to the first logic signal and the second logic signal. The oscillator compensates for an amount of variation of a reference current using a compensation current, thereby maintaining a constant period of the clock signal.

20 Claims, 6 Drawing Sheets

US 7,538,619 B2

OSCILLATOR REDUCING CLOCK SIGNAL VARIATIONS DUE TO VARIATIONS IN VOLTAGE OR TEMPERATURE

BACKGROUND OF THE INVENTION

1. Field of the Invention

The present invention relates to an oscillator. More particularly, the invention relates to an oscillator capable of reducing variations in the period of a clock signal caused by voltage or temperature variations.

This application claims the benefit of Korean Patent Application No. 10-2006-0040514 filed on May 4, 2006, the subject matter of which is hereby incorporated by reference.

2. Description of the Related Art

Figure (FIG.) 1 is a circuit diagram of a conventional oscillator 10.

Referring to FIG. 1, conventional oscillator 10 includes a reference current generator 11, an RS slope generator 12, and a clock signal generator 13. A reference voltage Vref is derived from a reference current Iref generated by reference current generator 11. Reference voltage Vref is applied to RS slope generator 12.

RS slope generator 12 includes a first inverter INV1 inverting a clock signal CLK in a feedback loop and a second inverter INV2 inverting the logical inverse of the clock signal, hereafter "inverse clock signal", CLKB. A first capacitor C1 and a second capacitor C2 are charged or discharged according to the respective outputs of the first and second inverters INV1 and INV2.

Since the first and second capacitors C1 and C2 are charged or discharged in response to the clock signal CLK and the inverse clock signal CKLB, a first voltage VC1 across the first capacitor C1 and a second voltage VC2 across the second capacitor C2 are respectively output to generate an output waveform of constant period.

A first amplifier AMP1 of RS slope generator 12 compares the first voltage VC1 with the reference voltage Vref and outputs a first comparison result. A second amplifier AMP2 of RS slope generator 12 compares the second voltage VC2 with the reference voltage Vref and outputs a second comparison result. That is, if either one of the first or second voltages, VC1 or VC2, is higher than the reference voltage Vref, the first or second amplifier AMP1 or AMP2 will output a logically "high" signal. If either of the first or second voltages, VC1 or VC2, is lower than the reference voltage Vref, the first or second amplifier, AMP1 or AMP2, will output a logically "low" signal.

Here, the respective first and second amplifier outputs, XL1 and XL2, have the same period. However, due to a signal delay difference caused by different charging/discharging speeds for the first and second capacitors, C1 and C2, the actual waveform timing of the logic levels communicated at the first and second amplifier outputs XL1 and XL2 are different.

Therefore, clock signal generator 13 includes latches receiving the first and second amplifier outputs XL1 and XL2. An output clock signal CLK and an inverse clock signal CLKB, both having a constant period are then provided by clock signal generator 13. As noted above, these signals are fed back to the first and second inverters INV1 and INV2 of RS slope generator 12, respectively.

However, in order to maintain a constant period for clock signal CLK, the first and second amplifier outputs XL1 and XL2 responsive to comparisons between the first and second voltages VC1 and VC1 and the reference voltage Vref must be maintained at a constant period. This requires that the reference voltage Vref be maintained at a constant amplitude.

However, experience has shown that within the typical operation of conventional oscillator 10, the reference current Iref from which the reference voltage Vref is derived is not maintained at a constant level. Indeed, the reference voltage Vref is known to vary in accordance with variation in the supply voltage (VDD) and/or the operating temperature of the oscillator. Accordingly, conventional oscillator 10 routinely generates a clock signal having an irregular period. Such inconstancy in the period of the clock signal may cause erroneous operation of other circuits whose operation is controlled in relation to the clock signal.

As the operating speed of contemporary semiconductor devices increases, variations in the period of a controlling clock signal become less and less tolerable as they are increasingly likely to cause erroneous operations in associated circuitry.

SUMMARY OF THE INVENTION

Embodiments of the invention provide an oscillator capable of generating a clock signal having a constant period despite common variations in supply voltage and/or operating temperature.

In one embodiment, the invention provides an oscillator generating a clock signal having a constant period, comprising; a logic signal generator generating a first logic signal and a second logic signal in response to a reference signal, wherein the first and second logic signals have the same period but different logic level transition timing, and wherein the logic signal generator compensates for variations in the reference signal by applying at least one compensation current to thereby maintain the constant period of the clock signal, and a clock generator generating the clock signal in response to the first logic signal and the second logic signal.

In a related embodiment, the reference signal comprises a reference current and the logic signal generator comprises a first logic signal generator generating the first logic signal in response to the clock signal and a second logic signal generator generating the second logic signal in response to an inverse of the clock signal.

In another related embodiment, the first logic signal generator comprises; a first inverter receiving and inverting the clock signal, a first capacitor charging and discharging in response to an output of the first inverter and outputting a first voltage, a first compensation transistor connected in parallel with the first inverter and generating a first compensation current in accordance with variations in the reference current, and a first comparator comparing the first voltage with a reference voltage derived from the reference current and outputting the first logic signal. The second logic signal generator comprises; a second inverter receiving and inverting the inverse of the clock signal, a second capacitor charging and discharging in response to an output of the second inverter and generating a second voltage, a second compensation transistor connected in parallel with the second inverter and generating a second compensation current in accordance with variations in the reference current, and a second comparator comparing the second voltage with the reference voltage and outputting the second logic signal.

In another embodiment, the invention provides an oscillator for generating a clock signal having a constant period, comprising; a reference generator generating a reference current from an applied supply voltage, wherein the reference current varies with variations in the supply voltage and with operating temperature for the oscillator, a logic signal generator comprising a first logic signal generator generating a first logic signal in response to a reference voltage derived from the reference current, and second logic signal generator generating a second logic signal in response to the reference voltage, wherein the reference voltage varies with variations in the supply voltage and with operating temperature for the oscillator, and wherein the first and second logic signals have the same period but different logic level transition timing, a clock generator generating the clock signal in response to the first logic signal and the second logic signal, wherein the logic signal generator compensates for variations in the reference current to main the constant period of the clock signal by applying a first compensation current in the first logic signal generator and a second compensation current in the second logic signal generator.

DESCRIPTION OF EMBODIMENTS

Figure 1:
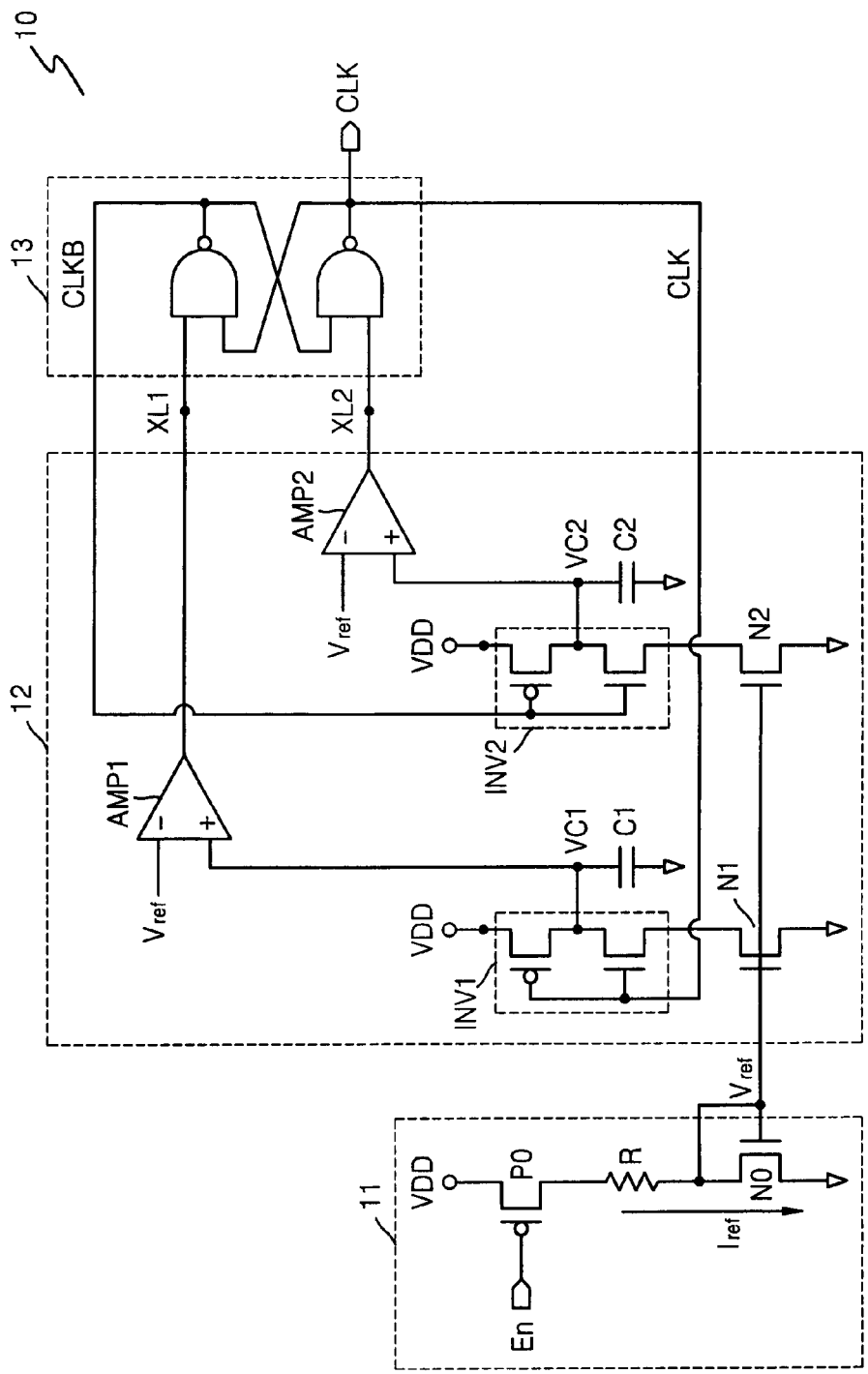
FIG. 1 is a circuit diagram of a conventional oscillator.

Certain embodiments of the present invention will now be described in some additional detail with reference to the attached drawings. It will, however, be understood that the illustrated embodiments are merely exemplary of a broader invention defined by the following claims. Through the written description and drawings, like reference numerals are used to indicate like or similar elements.

Figure 2:
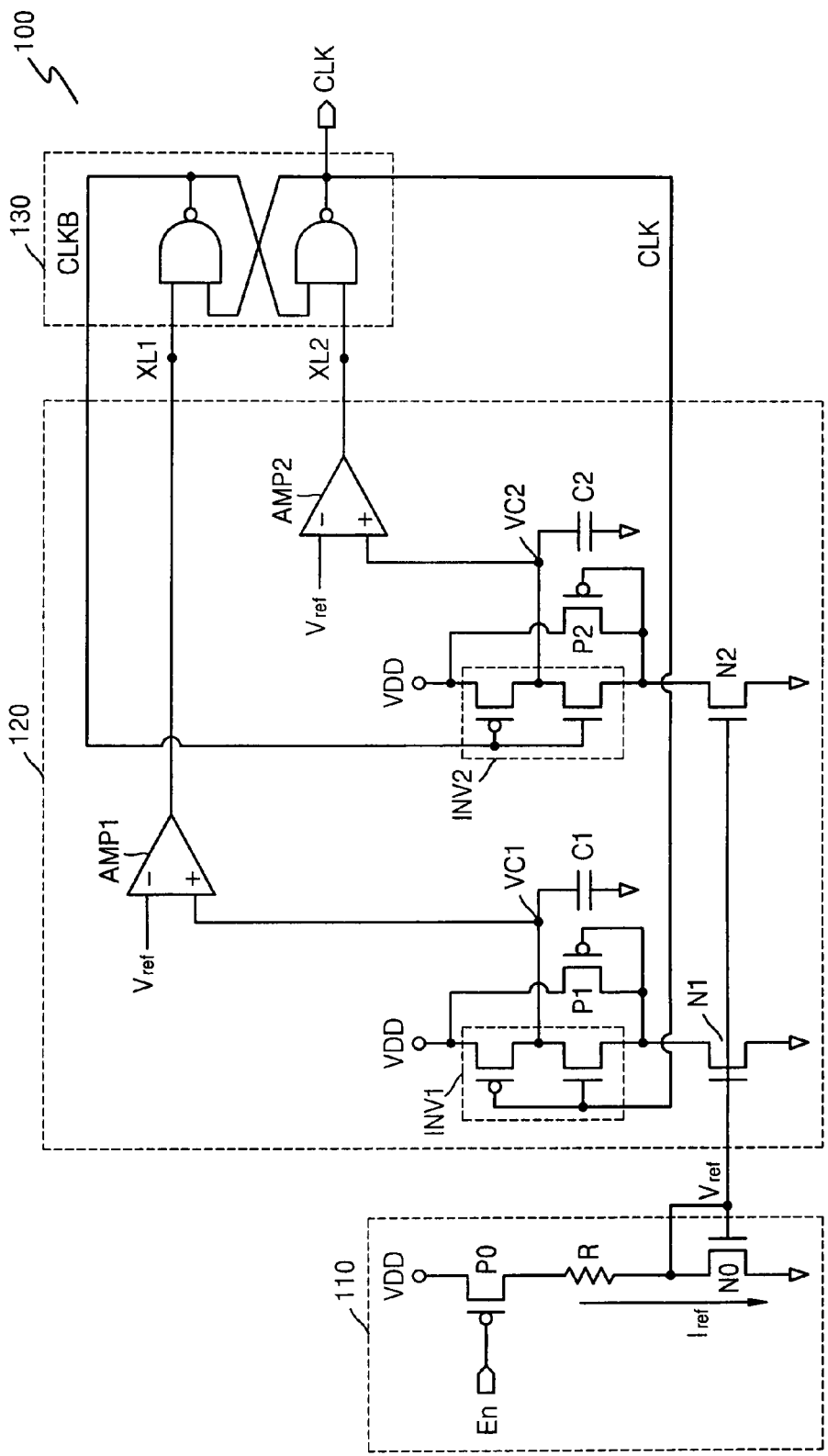
FIG. 2 is a circuit diagram of an oscillator according to an embodiment of the present invention.

FIG. 2 is a circuit diagram of an oscillator 100 according to an embodiment of the present invention. FIGS. 3A through 3G are timing diagrams related to the operation of the oscillator shown in FIG. 2.

Referring collectively to FIGS. 2 and 3A through 3G, oscillator 100 includes a logic signal generator 120 and a clock generator 130. In the illustrated example, oscillator 100 also includes a reference generator 110 generating a reference signal. The reference signal may be a reference current Iref and/or a reference voltage Vref. However, the reference signal(s) may be otherwise provided to logic signal generator 120 (e.g., from an external circuit), and therefore the inclusion of a specific reference generator 100 is deemed optional to embodiments of the invention.

Logic signal generator 120 generates a first logic signal XL1 and a second logic signal XL2 respectively having the same period but also having different logic transition timing. The first logic signal XL1 and the second logic signal XL2 are respectively shown in the waveforms FIGS. 3D and 3E.

Figure 3:
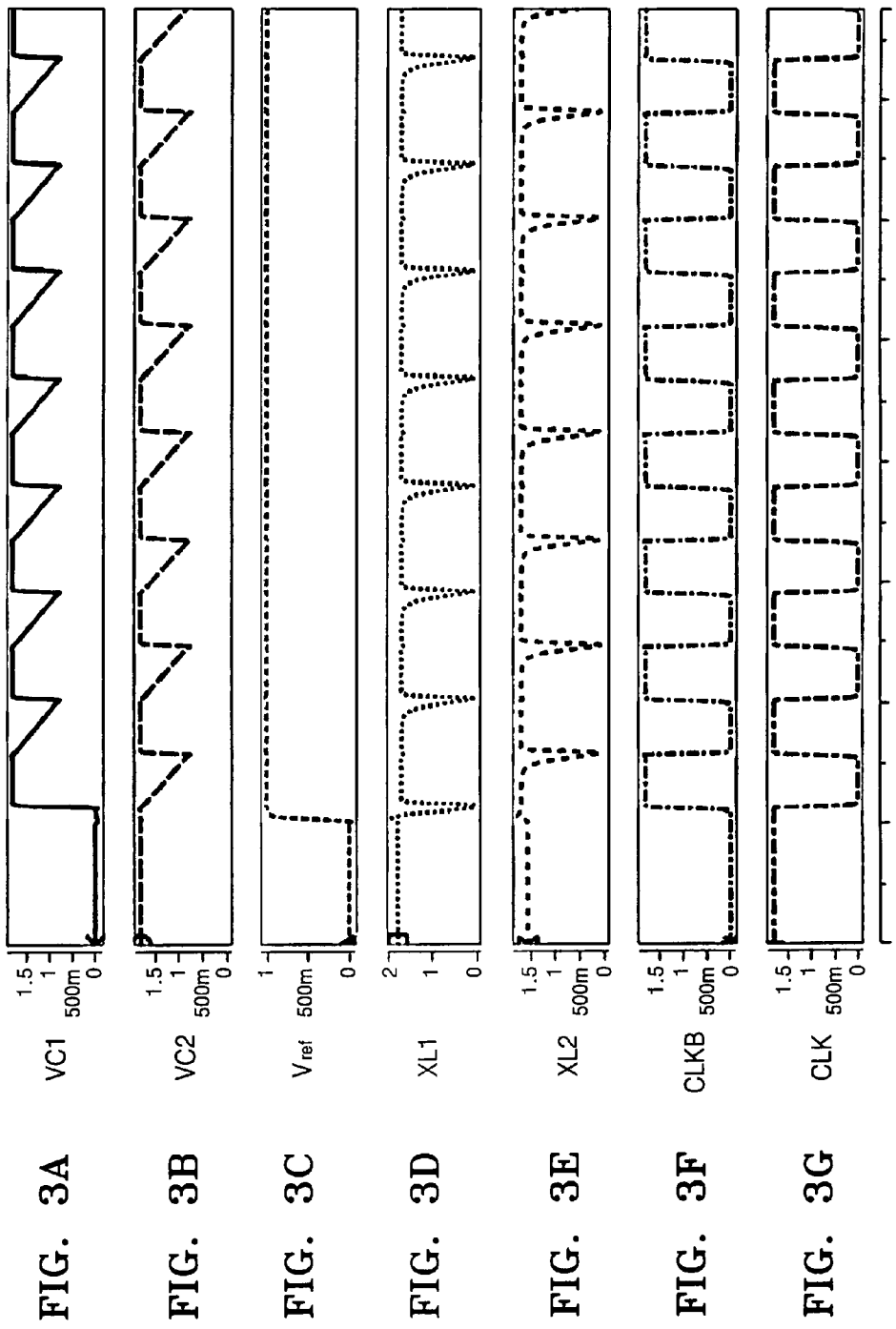
FIGS. 3A through 3G are timing diagrams related to the operation of the oscillator illustrated in FIG. 2.

Clock generator 130 generates an output clock signal CLK and an inverse clock signal CLKB in response to the first logic signal XL1 and the second logic signal XL2, as shown respectively in FIGS. 3G and 3F.

In the illustrated embodiment of FIG. 2, clock generator 130 comprises a latch receiving the first logic signal XL1 and the second logic signal XL2 and outputting the clock signal CLK and the inverse signal CLKB. Here, the clock signal CLK has a period corresponding to the respective periods of the first logic signal XL1 and the second logic signal XL2.

The reference current Iref and corresponding reference voltage Vref are generated by reference generator 110 in response to an externally applied enable signal, EN. In the illustrated embodiment, reference generator 110 comprises a first transistor P0 connected to supply voltage VDD and gated by the enable signal, and a resistor R and second transistor N0 connecting the output of the first transistor P0 to ground. In this example, reference current Iref output from the first transistor P0 and passing through resistor R develops reference voltage Vref applied to logic signal generator 120. Here, the first transistor P0 is a PMOS transistor and the second transistor N0 is a NMOS transistor.

As noted above, the reference current Iref may vary with variations in the supply voltage VDD or temperature. Thus, the reference voltage Vref may also similarly vary.

However unlike conventional oscillators, oscillator 100 according to an embodiment of the invention compensates for such variations in the reference current Iref by means of compensation currents Ip1 and Ip2. In this manner, a clock signal CLK and an inverse clock signal CLKB may be generated with a constant period.

Figure 4:
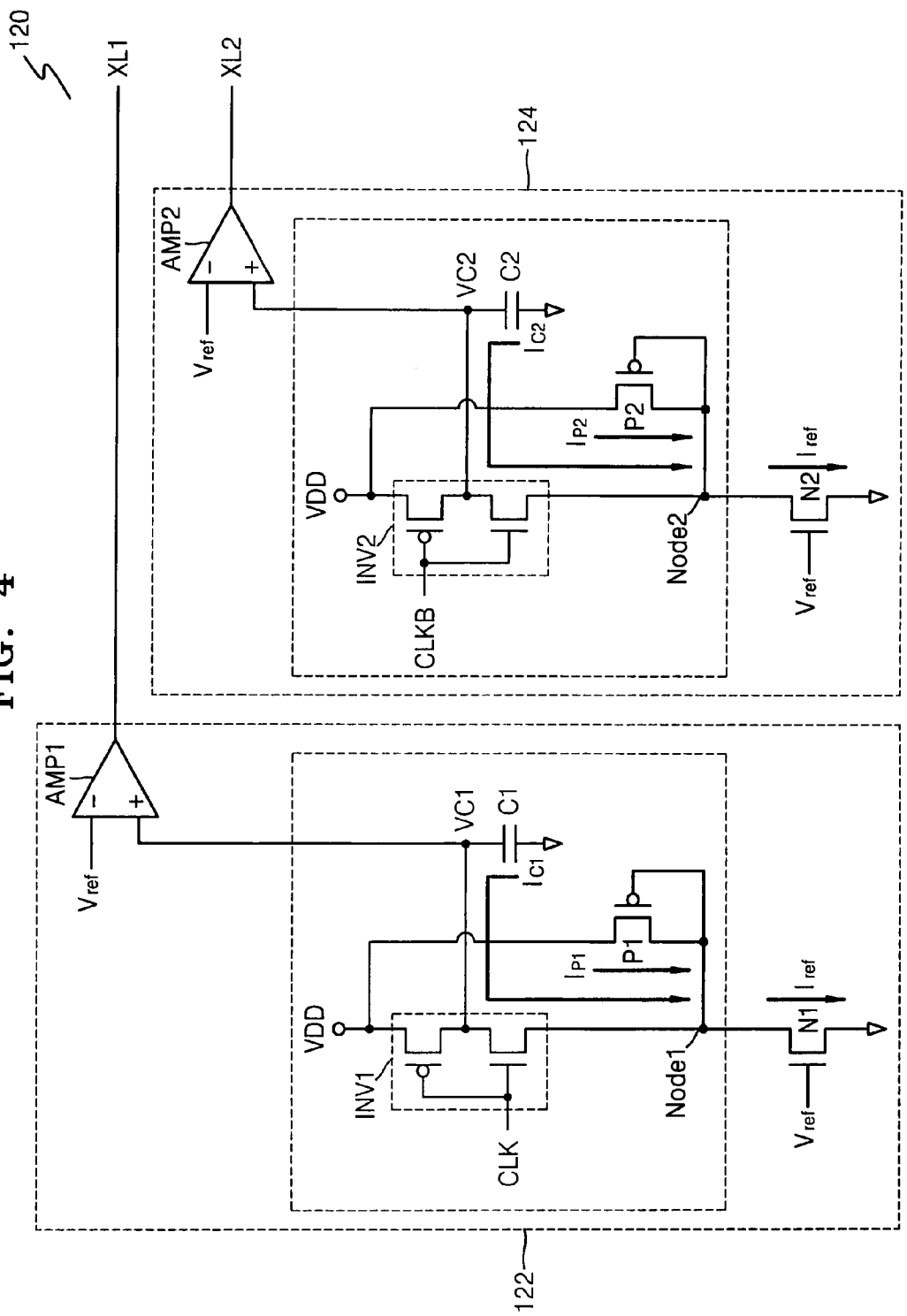
FIG. 4 is a circuit diagram of a logic signal generator illustrated in FIG. 2.

FIG. 4 is a circuit diagram illustrating logical signal generator 120 of FIG. 2 in some additional detail.

Referring to FIGS. 2 and 4, logic signal generator 120 comprises a first logic signal generator 122 and a second logic signal generator 124. First logic signal generator 122 generates the first logic signal XL1 in response to the clock signal CLK. First logic signal generator 122 includes a first inverter INV1, a first capacitor C1, a first compensation transistor P1, and a first compensator AMP1.

Second logic signal generator 124 generates the second logic signal XL2 in response to the inverse signal CLKB of the clock signal CLK. Second logic signal generator 124 includes a second inverter INV2, a second capacitor C2, a second compensation transistor P2, and a second comparator AMP2.

First logic signal generator 122 and second logic signal generator 124 have essentially the same circuit construction and operation in similar manner with respect to different clock signal logics in order to generate the first logic signal XL1 and the second logic signal XL2. Therefore, a description will be given based on first logic signal generator 122 with an understanding that it may be similarly applied to second logic signal generator 124.

Within first logic signal generator 122, the first inverter INV1 receives and inverts the clock signal CLK. (In contrast, within second logic signal generator 124, the second inverter INV2 receives and inverts the inverse signal CLKB). A first voltage VC1 associated with the first capacitor C1 varies with the output of the first inverter INV1. That is, the first capacitor C1 is charged or discharged in response to the output of the first inverter INV1.

For the illustrated embodiment, the first voltage VC1 has the waveform shown in FIG. 3A. This waveform generally results from a difference between the speed at which the first capacitor C1 is charged and the speed at which it is discharged. For the same reason, a second voltage VC2 associated with the second capacitor C2 of the second logic signal generator 124 has a similarly shaped waveform, as is shown in FIG. 3B.

The first comparator AMP1 compares the first voltage VC1 with the reference voltage Vref to output the first logic signal XL1. In the illustrated example, the first comparator AMP1 is implemented as an amplifier having a logical high output under the assumed conditions and generates the first logic signal XL1 if the first voltage VC1 is higher than the reference voltage Vref.

That is, the first logic signal XL1 has a waveform corresponding to the amplitudes of the first voltage VC1 and the reference voltage Vref. In the illustrated embodiment, the first logic signal XL1 has a constant period, as shown in FIG. 3D, and as developed in response to the first voltage VC1 shown in FIG. 3A and reference voltage Vref shown in FIG. 3C.

Likewise, the second logic signal XL2 has a waveform corresponding to the amplitudes of the second voltage VC2 and the reference voltage Vref. The second logic signal XL2 has a constant period as shown in FIG. 3E and as developed in response to the second voltage VC2 shown in FIG. 3B and the reference voltage Vref shown in FIG. 3C.

When the supply voltage VDD and/or temperature varies, oscillator 100 according to an embodiment of the present invention, generates compensation currents Ip1 and Ip2, to thereby compensate for the resulting variations in the reference current Iref. The compensation currents Ip1 and Ip2 are generated by the first and second compensation transistors P1 and P2.

Referring again to FIGS. 2 and 4, the first compensation transistor P1 of first logic signal generator 122 is connected in parallel with (i.e., strapped across) the first inverter INV1 and generates a first compensation current Ip1 in response to variations in the reference current Iref. The first compensation transistor P1 may be a PMOS transistor which is turned ON in response to variations in the reference current Iref.

First logic signal generator 122 may further comprise a first copy transistor N1 copying the reference current Iref provided by reference generator 110. The first copy transistor N1 is connected between a ground and a first node (Node1) through which the first inverter INV1 is connected to the first compensation transistor P1. The first copy transistor N1 may be a NMOS transistor N1 having a gate connected to the reference voltage Vref.

In the illustrated embodiment, the NMOS transistor N1 is turned ON when the reference voltage Vref exceeds a predetermined threshold. Since the gate voltage of the NMOS transistor N1 is equal to the gate voltage of the NMOS transistor N0, the NMOS transistor N1 generates a current equal to the reference current Iref.

When the supply voltage VDD increases, the reference voltage Vref also increases. Due to the increase of the reference voltage Vref, the reference current Iref increases, and accordingly, the current flowing through the NMOS transistor N1 and copying the reference current Iref also increases.

If the current flowing through the NMOS transistor N1 increases, a voltage apparent at the first node (Node 1) decreases. However, as the voltage apparent at the first node (Node 1) decreases, the first compensation current Ip1 generated by the PMOS transistor P1 increases. Also, as the first compensation current Ip1 increases, the voltage apparent at the first node (Node1) increases. The voltage increase at the first node (Node 1) decreases the first compensation current Ip1.

Accordingly, the current flowing through the NMOS transistor N1, which corresponds to the sum of the first capacitor current Ic1 and the first compensation current Ip1, decreases. Thus, the reference voltage Vref and the reference current Iref flowing through the NMOS transistor N0 decrease, so that the reference voltage Vref is maintained constant.

As a result, the reference current Iref and the reference voltage Vref have constant values regardless variations in the supply voltage VDD, due to a negative feedback path formed through first compensation transistor P1. That is, oscillator 100 maintains a constant reference voltage Vref, as illustrated in FIG. 3C by means of compensation currents Ip1 and Ip2 even when the supply voltage V varies. Accordingly, oscillator 100 is able to generate a clock signal CLK having a constant period.

As the actual value of the resistance R within reference generator 110 varies with variations in operating temperature, the clock signal CLK may yet be generated according to the above-described operation even when the reference current Iref and the reference voltage Vref vary.

Figure 5:
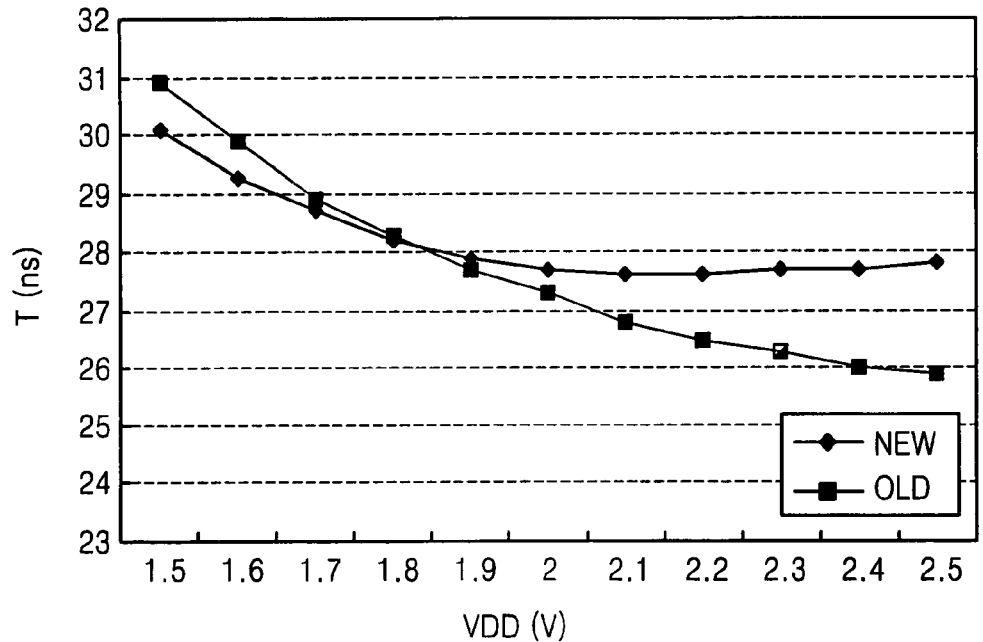
FIG. 5 is a graph respectively plotting period variations for clock signals generated by the oscillators of FIGS. 1 and 2, with respect to variations in supply voltage.
Figure 6:
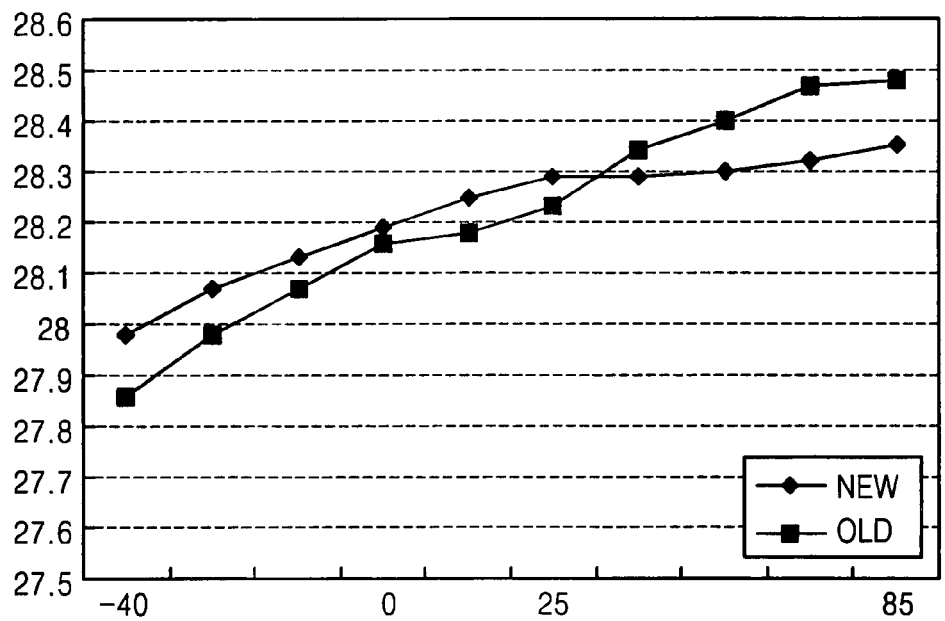
FIG. 6 is a graph respectively plotting period variations for clock signals generated by the oscillators of FIGS. 1 and 2, with respect to variation in operating temperature.
Figure 7:
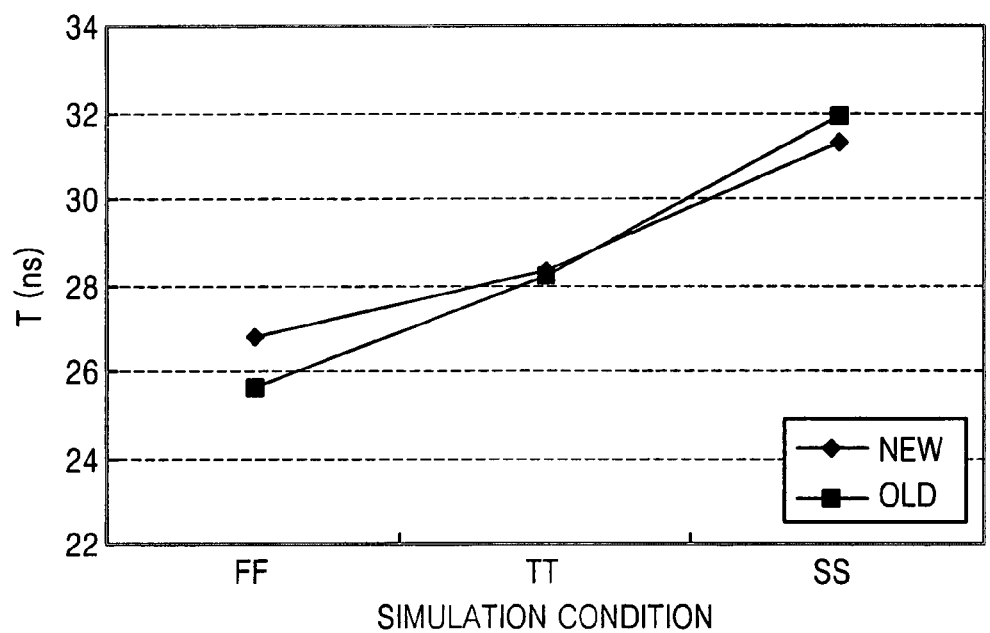
FIG. 7 is a graph respectively plotting period variations for clock signals generated by the oscillators of FIGS. 1 and 2 under nominal operating conditions and two assumed worst case conditions, respectively.

FIG. 5 is a graph respectively plotting period variations for clock signals generated by the oscillators of FIGS. 1 and 2 with respect to a variation in voltage. FIG. 6 is a graph respectively plotting period variations for clock signals generated by the oscillators of FIGS. 1 and 2 with respect to a variation in temperature. FIG. 7 is a graph respectively plotting period variations for clock signals generated by the oscillators of FIGS. 1 and 2, when a process, a temperature, and a supply voltage are under worst conditions, in normal conditions, and in optimal conditions, respectively.

Referring collectively to FIGS. 5, 6, and 7, when variations in voltage and/or temperature occur, a period variation for the clock signal generated by oscillator 100 shown in FIG. 2 according to an embodiment of the invention is significantly smaller than that for a clock signal generated by conventional oscillator 10 shown in FIG. 1.

FIG. 5 is a graph respectively plotting period variations for clock signals when a supply voltage VDD is swept at 0.1 V intervals across a range of 1.5 V to 2.5 V for the respective circuits operating at a stable temperature of 25° C. In contrast, FIG. 6 is a graph respectively plotting period variations for clock signals as the respective circuits are operated at a stable supply voltage VDD of 1.8V but with an operating temperature that varies across a range of −40 to +85° C.

The reference symbol FF shown in FIG. 7 corresponds to high speed operating with a high supply voltage VDD of 2.0 V and a low operating temperature of −40° C. Reference symbol TT of FIG. 7 corresponds to normal speed operation at a nominal supply voltage VDD of 1.8 V and a nominal operating temperature of 25° C. Reference symbol SS of FIG. 7 corresponds to low speed operation at a low supply voltage VDD of 1.6 V at a high operating temperature of 85° C.

Recourse to the results plotted in FIGS. 5, 6, and 7 clearly illustrate greater clock period variance from the conventional ("OLD") circuit, as compared to an embodiment of the invention ("NEW").

As described above, in an oscillator according to an embodiment of the invention, reference current and corresponding reference voltage variations caused by supply voltage variations and/or operating temperature variations are mitigated (i.e., compensated for) by compensation currents applied in associated logic signal generating circuits. As a result, more stable clock signals are provided having less period variance over voltage and temperature ranges. Greater stability in the resulting clock signals prevents downstream circuit operation failures due to variable controlling clock signals.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. An oscillator generating a clock signal having a constant period, comprising:

a clock generator generating a clock signal in response to a first logic signal and a second logic signal, wherein the first and second logic signals have the same period but different logic level transition timing;

a logic signal generator generating the first logic signal and the second logic signal in response to a reference signal corresponding to a reference current, and compensating for variations in the reference signal by applying at least one of a first compensation current and a second compensation current to thereby maintain the constant period of the clock signal, wherein the first compensation current and the second compensation current increase and then decrease as the reference current increases, and the first compensation current and the second compensation current decrease and then increase as the reference current decreases.

2. The oscillator of claim 1, wherein the constant period of the clock signal is derived from the period of the first logic signal and the period of the second logic signal.

3. The oscillator of claim 1, wherein the logic signal generator comprises a first compensation transistor generating the first compensation current.

4. The oscillator of claim 3, wherein the first compensation transistor is a PMOS transistor which is turned ON in response to the reference current.

5. The oscillator of claim 1, wherein the logic signal generator comprises:
a first logic signal generator generating the first logic signal in response to the feedback of the clock signal; and
a second logic signal generator generating the second logic signal in response to the feedback of an inverse of the clock signal.

6. The oscillator of claim 5, wherein the first logic signal generator comprises:
a first inverter receiving and inverting the feedback of the clock signal;
a first capacitor charging and discharging in response to an output of the first inverter and outputting a first voltage;
a first compensation transistor connected in parallel with the first inverter and generating the first compensation current in accordance with variations in the reference current; and
a first comparator comparing the first voltage with a reference voltage derived from the reference current and outputting the first logic signal.

7. The oscillator of claim 6, wherein the first compensation transistor is a PMOS transistor which is turned ON in response to the reference current.

8. The oscillator of claim 6, wherein the first comparator is an amplifier outputting the first logic signal at a high logic level when the first voltage is greater than the reference voltage.

9. The oscillator of claim 6, wherein the first logic signal generator further comprises:
a first copy transistor copying the reference current.

10. The oscillator of claim 9, wherein the first copy transistor is an NMOS transistor gated by the reference voltage and connected between ground and a first node at which the outputs of the first inverter and first compensation transistor are connected.

11. The oscillator of claim 6, wherein the second logic signal generator comprises:
a second inverter receiving and inverting the inverse of the feedback of the clock signal;
a second capacitor charging and discharging in response to an output of the second inverter and generating a second voltage;
a second compensation transistor connected in parallel with the second inverter and generating the second compensation current in accordance with variations in the reference current; and
a second comparator comparing the second voltage with the reference voltage and outputting the second logic signal.

12. The oscillator of claim 11, wherein the second compensation transistor is a PMOS transistor which is turned ON in response the reference current.

13. The oscillator of claim 11, wherein the second comparator is an amplifier outputting the second logic signal at a high logic level when the second voltage is greater than the reference voltage.

14. The oscillator of claim 11, wherein the second logic signal generator further comprises:
a second copy transistor copying the reference current.

15. The oscillator of claim 14, wherein the second copy transistor is an NMOS transistor gated by the reference voltage and connected between ground and a second node at which the outputs of the second inverter and the second compensation transistor are connected.

16. The oscillator of claim 1, wherein the clock generator comprises a latch receiving the first logic signal and the second logic signal, and outputting the clock signal and the inverse of the clock signal.

17. The oscillator of claim 1, further comprising:
a reference generator generating a reference current and a corresponding reference voltage as the reference signal in response to an enable signal.

18. The oscillator of claim 17, wherein the reference generator comprises:
a first transistor connected to a supply voltage and gated by the enable signal;
a second transistor passing the reference current to ground; and
a resistor connected between the first transistor and the second transistor and developing the reference voltage.

19. The oscillator of claim 1, wherein the reference signal varies in accordance with variations in at least one of a supply voltage and operating temperature for the oscillator.

20. An oscillator for generating a clock signal having a constant period, comprising:
a reference generator generating a reference current from an applied supply voltage, wherein the reference current varies with variations in the supply voltage and with operating temperature for the oscillator;
a logic signal generator comprising a first logic signal generator generating a first logic signal in response to a reference voltage derived from the reference current, and second logic signal generator generating a second logic signal in response to the reference voltage, wherein the reference voltage varies with variations in the supply voltage and with operating temperature for the oscillator, and wherein the first and second logic signals have the same period but different logic level transition timing;
a clock generator generating the clock signal in response to the first logic signal and the second logic signal,
wherein the logic signal generator compensates for variations in the reference current to main the constant period of the clock signal by applying a first compensation current in the first logic signal generator and a second compensation current in the second logic signal generator, wherein the first compensation current and second compensation current increase and then decrease as the reference current increases, and the first compensation current and second compensation current decrease and then increase as the reference current decreases.

* * * * *